(12) United States Patent
Cheng et al.

(10) Patent No.: US 8,466,553 B2
(45) Date of Patent: Jun. 18, 2013

(54) SEMICONDUCTOR DEVICE AND SEMICONDUCTOR PACKAGE HAVING THE SAME

(75) Inventors: Bing-Hong Cheng, Kaohsiung (TW); Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 246 days.

(21) Appl. No.: 12/902,840

(22) Filed: Oct. 12, 2010

(65) Prior Publication Data

US 2012/0086122 A1    Apr. 12, 2012

(51) Int. Cl.
*H01L 23/48* (2006.01)

(52) U.S. Cl.
USPC .... 257/738; 257/734; 257/774; 257/E23.145; 257/E23.161; 257/E23.163

(58) Field of Classification Search
USPC .......... 257/738, 774, 737, E23.145, E23.161, 257/E23.163
See application file for complete search history.

(56) References Cited

U.S. PATENT DOCUMENTS

| 2005/0127492 A1* | 6/2005 | Howard et al. ............... 257/691 |
| 2010/0047963 A1 | 2/2010 | Wang et al. |
| 2010/0090318 A1 | 4/2010 | Hsu et al. |
| 2010/0090319 A1 | 4/2010 | Hsu et al. |
| 2010/0140805 A1 | 6/2010 | Chang et al. |
| 2011/0095413 A1* | 4/2011 | Barth et al. ................... 257/685 |
| 2011/0254160 A1* | 10/2011 | Tsai et al. ..................... 257/738 |
| 2012/0001337 A1* | 1/2012 | Tsai et al. ..................... 257/770 |

FOREIGN PATENT DOCUMENTS

CN    102148172 A    8/2011

OTHER PUBLICATIONS

Sipo Office Action dated Jun. 5, 2012, for Chinese Patent Application No. 201110043258.6 (6 pages), A complete English translation is required. See Office Action.

* cited by examiner

*Primary Examiner* — Long Tran
(74) *Attorney, Agent, or Firm* — McCracken & Frank LLC

(57) ABSTRACT

The present invention relates to a semiconductor device and a semiconductor package having the same. The semiconductor device includes a conductive element. The conductive element is disposed on a protruded conductive via and liner, and covers a sidewall of the liner. Whereby, the conductive element can protect the protruded conductive via and liner from being damaged. Further, the size of the conductive element is large, thus it is easy to perform a probe test process.

16 Claims, 21 Drawing Sheets

SEMICONDUCTOR DEVICE AND SEMICONDUCTOR PACKAGE HAVING THE SAME

BACKGROUND OF THE INVENTION

1. Field of the Invention

The present invention relates to a semiconductor device and a semiconductor package having the same, and more particularly to a semiconductor device having protruded via, and a semiconductor package having the same.

2. Description of the Related Art

FIGS. 1 to 13 show schematic views of a conventional semiconductor process for making a semiconductor device. Referring to FIG. 1, a semiconductor substrate 10 is provided. The semiconductor wafer 10 has a plurality of through-silicon vias 11 therein, and each of the through-silicon vias 11 is surrounded by a liner 12. Referring to FIG. 2, the through-silicon vias 11 and the liners 12 are exposed by a thinning process applied on the semiconductor substrate 10, so that the through-silicon vias 11 and the liners 12 protrude from one side surface of the semiconductor substrate 10. Referring to FIG. 3, a first isolation film 131 is formed over the side surface of the semiconductor substrate 10. Referring to FIG. 4, part of the first isolation film 131 and the liner 12 are removed, so that the top surface of the liner 12 is coplanar with the top surface of the first isolation film 131, and the through-silicon vias 11 protrude from top surface of the first isolation film 131. Referring to FIG. 5, a seed layer 14 is formed over the top surface of the isolation film 131 and the exposed portions of the through-silicon vias 11. Referring to FIG. 6, a first patterned mask 151 is formed over the seed layer 14. The first patterned mask 151 has a plurality of openings 152. The bottom portion of each of the openings 152 is wider than the top portion of each of the openings 152. Referring to FIG. 7, a plurality of conductive elements 16 are formed in the openings 152. Referring to FIG. 8, the first patterned mask 151 is removed. Referring to FIG. 9, the exposed portions of the seed layer 14 are removed. Referring to FIG. 10, a second isolation film 132 is formed over the conductive elements 16 and the top surface of the first isolation film 131. Referring to FIG. 11, a second patterned mask 153 is formed over the first isolation film 131. Referring to FIG. 12, the second isolation film 132 is patterned and the second patterned mask 153 is removed. Referring to FIG. 13, a metal layer 17 is formed on the conductive elements 16. The metal layer 17 is formed of a metal or metal alloy, such as Ni, AuSu, Au, or the like, using electroless plating techniques.

SUMMARY OF THE INVENTION

The present invention is directed to a semiconductor process, comprising the following steps: (a) providing a semiconductor device comprising a semiconductor substrate, a backside passivation and a conductive via, wherein the semiconductor substrate has a front surface and a backside surface, the backside passivation is disposed on the backside surface of the semiconductor substrate, the conductive via is disposed in the semiconductor substrate and surrounded by a liner except a top surface thereof, and the conductive via and the liner protrude from the backside passivation, and the top surface of the conductive via is substantially coplanar with a top surface of the liner; and (b) forming a conductive element on the top surface of the conductive via and the protruding portion of the liner.

In the present invention, the back end of the conductive via is covered by the conductive element (for example, a protection cap). Therefore, the conductive element can protect the back end from being damaged. Further, the size of the conductive element is large, thus it is easy to perform a probe test process.

The present invention is also directed to a semiconductor device, comprising a semiconductor substrate, a backside passivation, a conductive via and a conductive element. The semiconductor substrate has a front surface and a backside surface. The backside passivation is disposed on the backside surface of the semiconductor substrate. The conductive via is disposed in the semiconductor substrate and surrounded by a liner except a top surface thereof, wherein the conductive via and the liner protrude from the backside passivation, and the top surface of the conductive via is substantially coplanar with a top surface of the liner. The conductive element covers the top surface of the conductive via and the protruding portion of the liner.

The present invention is also directed to a semiconductor process, comprising the following steps: (a) providing a semiconductor device comprising a semiconductor substrate, a backside passivation and a conductive via, wherein the semiconductor substrate has a front surface and a backside surface, the backside passivation is disposed on the backside surface of the semiconductor substrate, the conductive via is disposed in the semiconductor substrate and surrounded by a liner, the conductive via and the liner protrude from the backside passivation, and a top surface of the conductive via is substantially coplanar with a top surface of the liner; (b) forming a conductive element (for example a redistribution layer (RDL)) having a first portion covering the top surface of the conductive via and the protruding portion of the liner; (c) forming a dielectric layer on the RDL and the backside passivation; (d) forming an opening in the dielectric layer to expose part of the RDL; and (e) forming a UBM in the opening.

The present invention is also directed to a semiconductor device, comprising a semiconductor substrate, a backside passivation, a conductive via, a conductive element (for example, a RDL), a dielectric layer, a second seed layer and a UBM. The semiconductor substrate has a front surface and a backside surface. The backside passivation is disposed on the backside surface of the semiconductor substrate. The conductive via is disposed in the semiconductor substrate and surrounded by a liner, wherein the conductive via and the liner protrude from the backside passivation, and a top surface of the conductive via is substantially coplanar with a top surface of the liner. The RDL covers the protruded conductive via and liner and part of the backside passivation. The dielectric layer is disposed over the RDL and the backside passivation, and having an opening to expose part of the RDL. The second seed layer is disposed in the opening and on part of the dielectric layer. The UBM is disposed over the seed layer.

The present invention is also directed to a semiconductor process for making a semiconductor package, comprising the above-mentioned semiconductor process.

The present invention is also directed to a semiconductor package, comprising the above-mentioned semiconductor device.

DETAILED DESCRIPTION OF THE INVENTION

Figure 1:
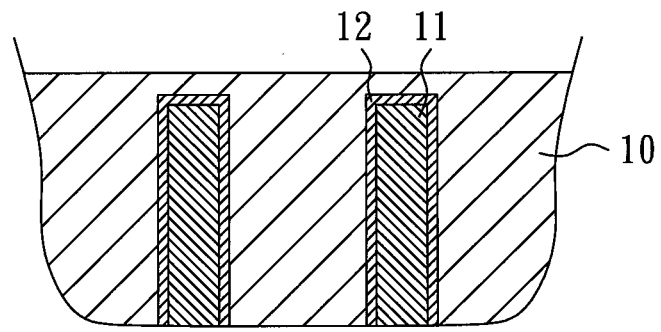
FIGS. 1 to 13 show schematic views of a conventional semiconductor process for making a semiconductor device.
Figure 2:
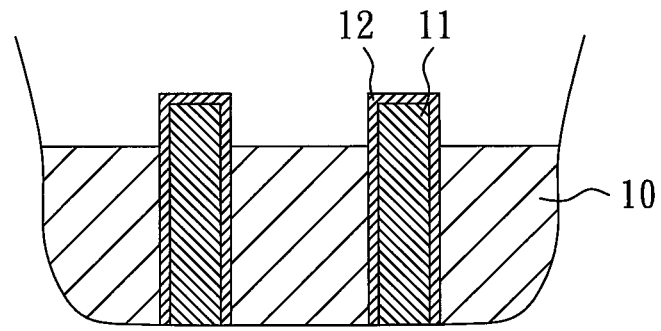
Figure 3:
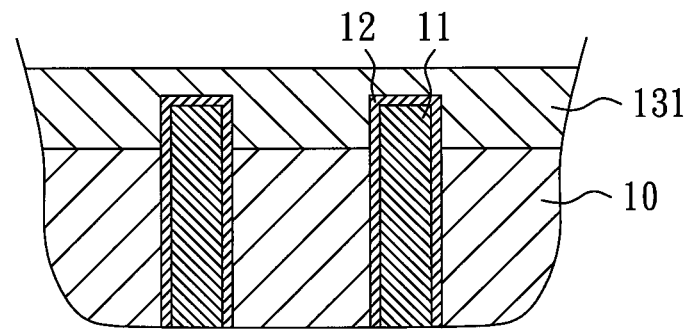
Figure 4:
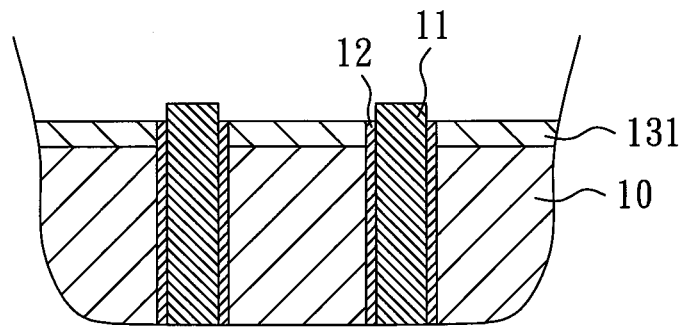
Figure 5:
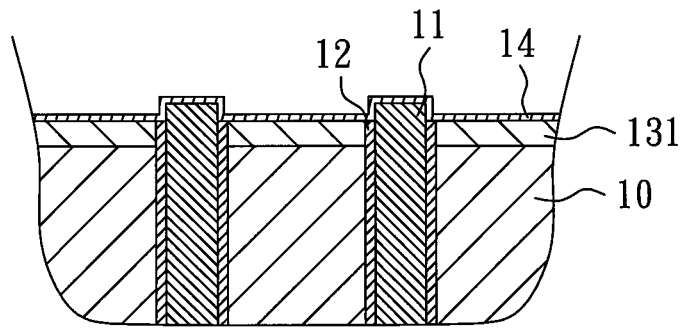
Figure 6:
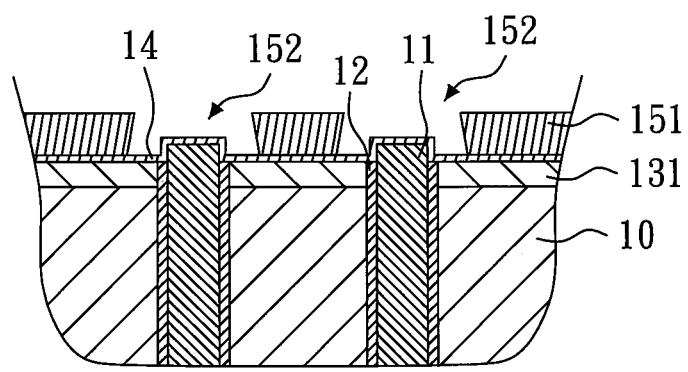
Figure 7:
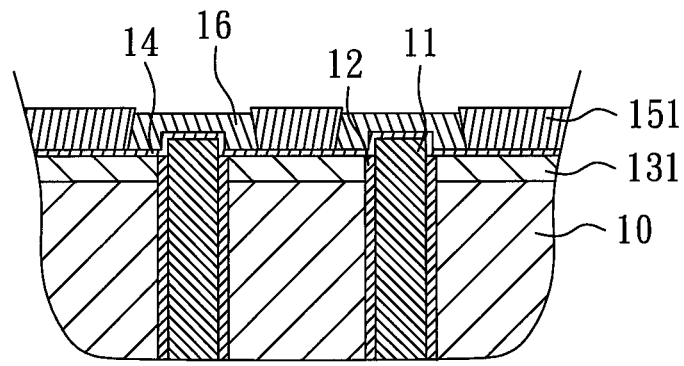
Figure 8:
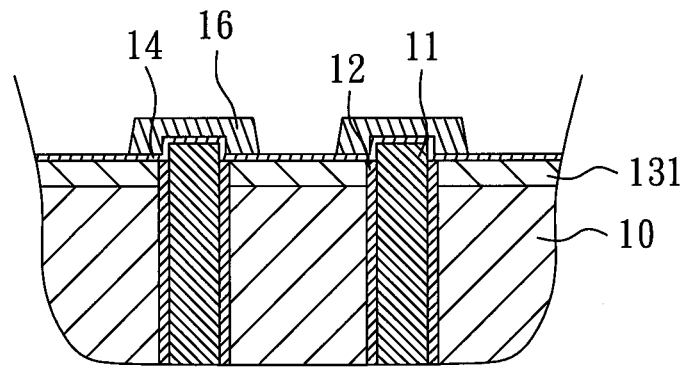
Figure 9:
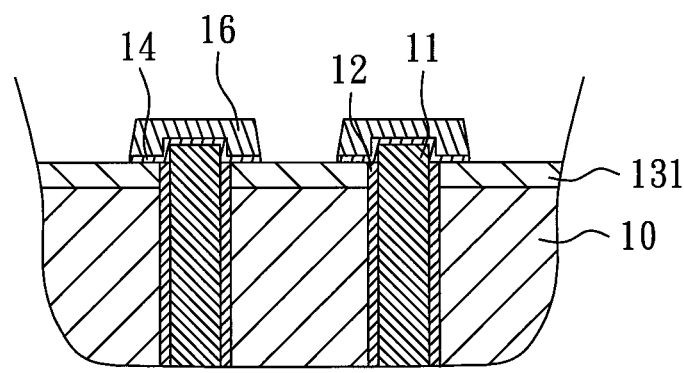
Figure 10:
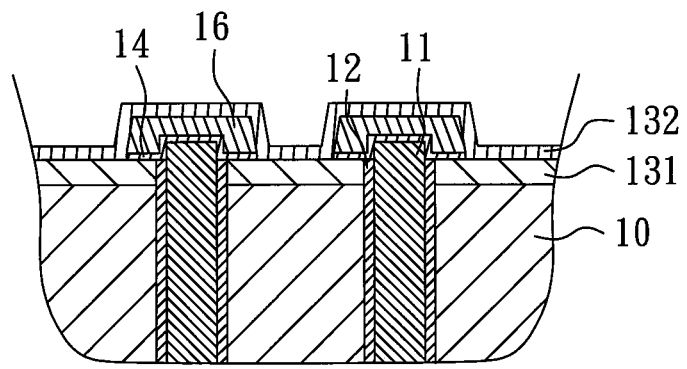
Figure 11:
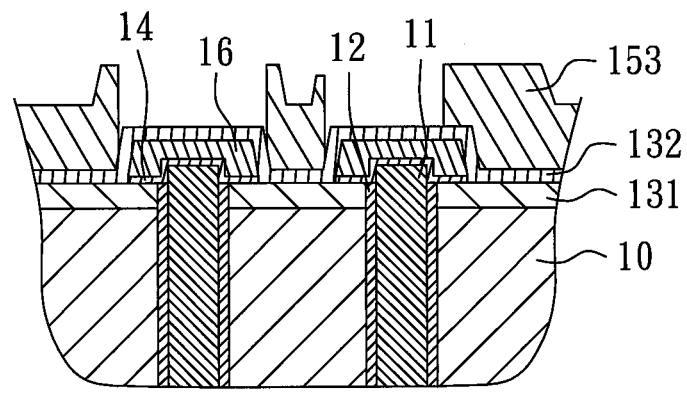
Figure 12:
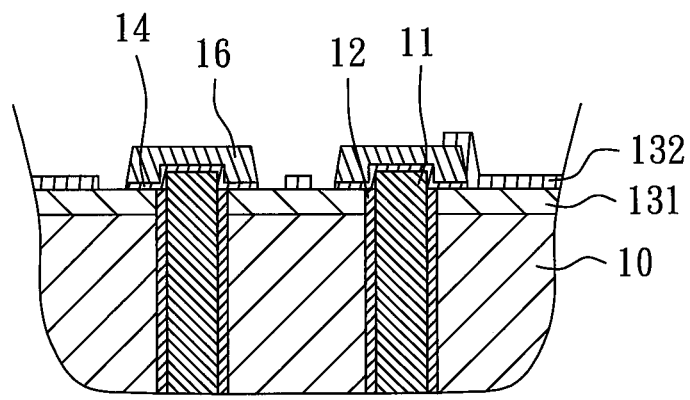
Figure 13:
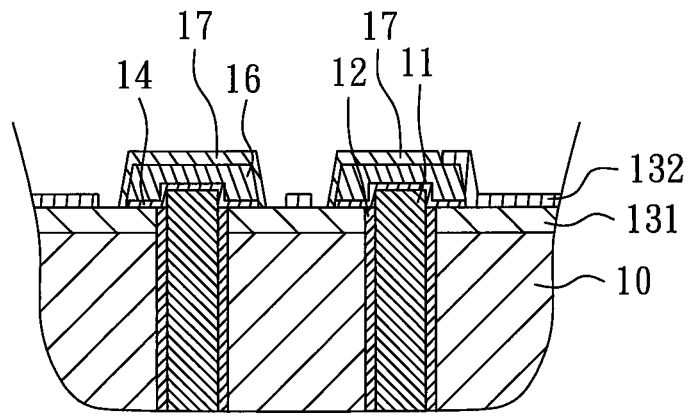
Figure 14:
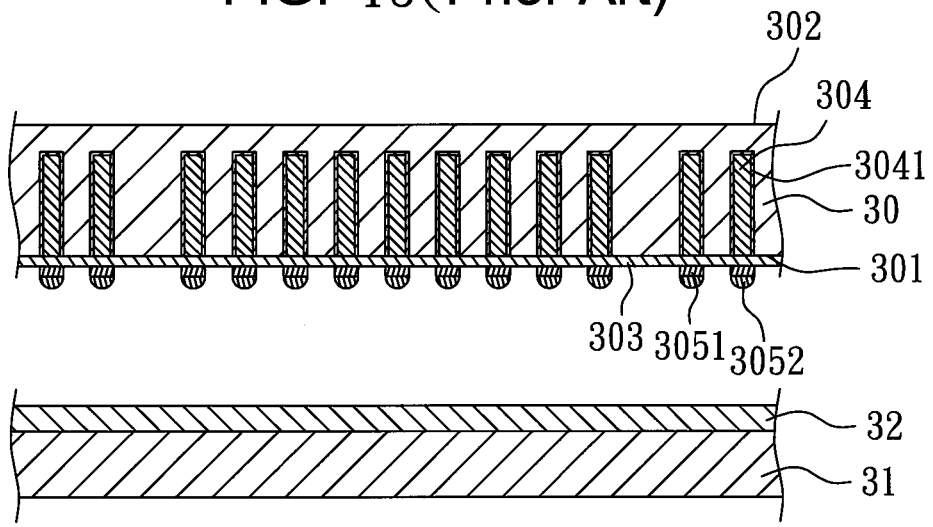
FIGS. 14 to 31 show the schematic views of the semiconductor process for making a semiconductor package according to a first embodiment of the present invention.

FIGS. 14 to 31 show the schematic views of the semiconductor process for making a semiconductor package according to a first embodiment of the present invention. Referring to FIG. 14, a semiconductor wafer 30 and a first carrier 31 are provided. The semiconductor wafer 30 has a front surface 301, a backside surface 302, a plurality of conductive vias 304 and a plurality of external connection elements 3052 (such as Cu pillars or solder bumps). The conductive vias 304 are disposed in the semiconductor wafer 30, and each of the conductive vias 304 is surrounded by a liner 3041. The external connection elements 3052 are respectively disposed on the bonding pads 3051. It could be understood that the external connection element 3052 is not an essential aspect of the present invention. If the external connection elements 3052 are skipped, the bonding pads 3051 are exposed for making external connection.

The wafer 30 can be an inactive silicon wafer without active circuitry embedded therein, or an active silicon wafer with active circuitry embedded therein. Where the wafer 30 is an active wafer, it would result in a functional die in the resulting stacked die package. Where the wafer 30 is an inactive wafer, it would function as an interposer for distributing finer pitch connections of the chip stacked above to larger pitch connections of the substrate below.

In this embodiment, the semiconductor wafer 30 further comprises one or more wiring layers 303 disposed on the front surface 301 thereof, and the external connection elements 3052 are electrically connected to the conductive vias 304 through the wiring layers 303. The wiring layers 301 comprise at least one dielectric layer and at least one wire. The wire is disposed in the dielectric layer. The wire may be formed of copper, copper alloys or other conductive metal, and may be formed using the well-known damascene processes. Further, the wiring layers 301 may include commonly known inter-layer dielectric (ILD) and inter-metal dielectrics (IMDs).

The conductive vias 304 and the liners 3041 may be formed by any appropriate method. For example, openings may be formed extending into the wafer's semiconductor substrate prior to or after forming the wiring layers 303 by, for example, one or more etching processes, milling, laser techniques, or the like. Preferably, the liner 3041 comprises one or more layers of SiN, an oxide, a polymer, or the like, and the conductive via comprises copper, tungsten, aluminum, silver, and combinations thereof, or the like. Other materials, including conductive diffusion barrier layers, such as TaN, Ta, TiN, Ti, CoW, or the like, may also be used. The semiconductor wafer 30 may comprise a front passivation layer (not shown).

Figure 15:
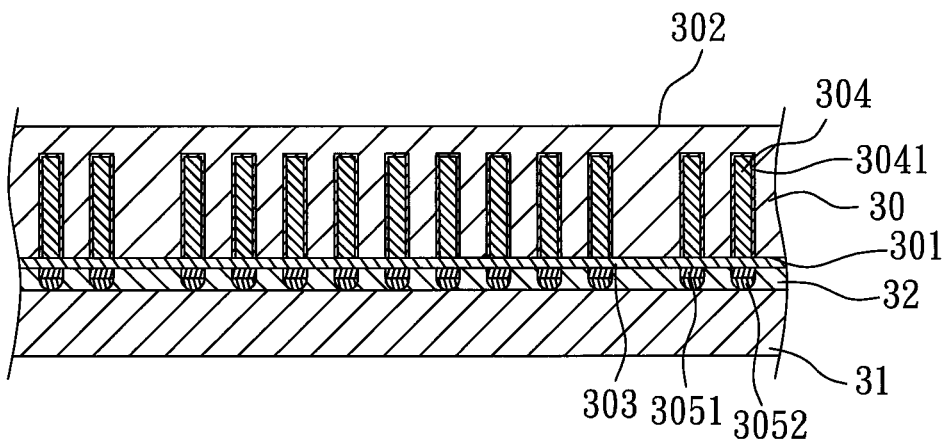
Figure 16:
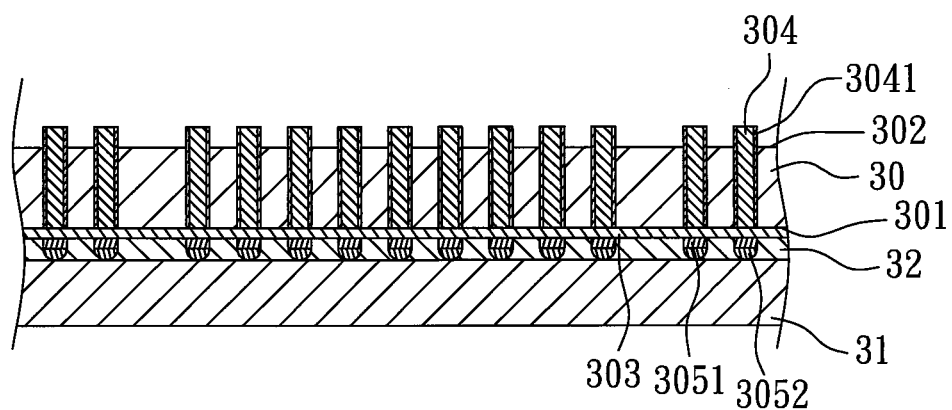
Figure 17:
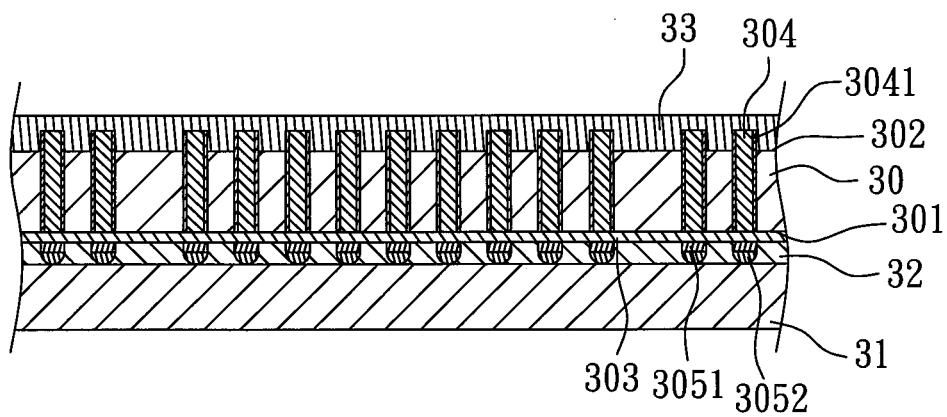
Figure 18:
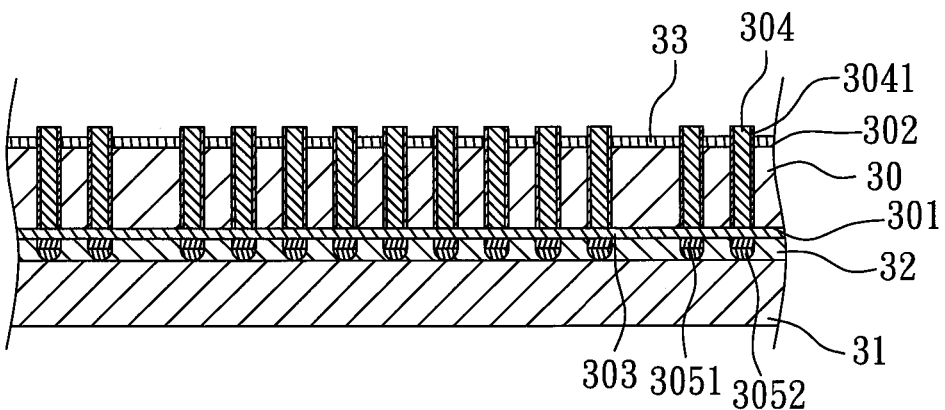

Referring to FIG. 15, the front surface 301 of the semiconductor wafer 30 is mounted to the first carrier 31 by a first adhesive layer 32. Referring to FIG. 16, a thinning process is performed on the backside surface 302 of the semiconductor wafer 30, so as to expose the back ends of the conductive vias 304. The thinning process comprises a step of grinding or CMP and/or a following etching step. Note that, in the thinning process, only the top portion of each liner 3041 is removed such that a top surface of each conductive via 304 is exposed and substantially coplanar with a top surface of the remaining portion of each liner 3041. Referring to FIG. 17, a backside passivation 33 (such as a photoresist layer (e.g., BCB) or a non-conductive polymer) is formed over the backside surface 302 and covers the exposed portions of the conductive vias 304 and the liners 3041. Referring to FIG. 18, part of the backside passivation 33 is removed (for example, by developing or etching) so that the conductive vias 304 and end portions of the liners 3041 protrude from the backside passivation 33. It is to be noted that the end portions of the liners 3041 are not removed, and the top surface of the conductive vias 304 is substantially coplanar with the top surface of the liners 3041.

Figure 19:
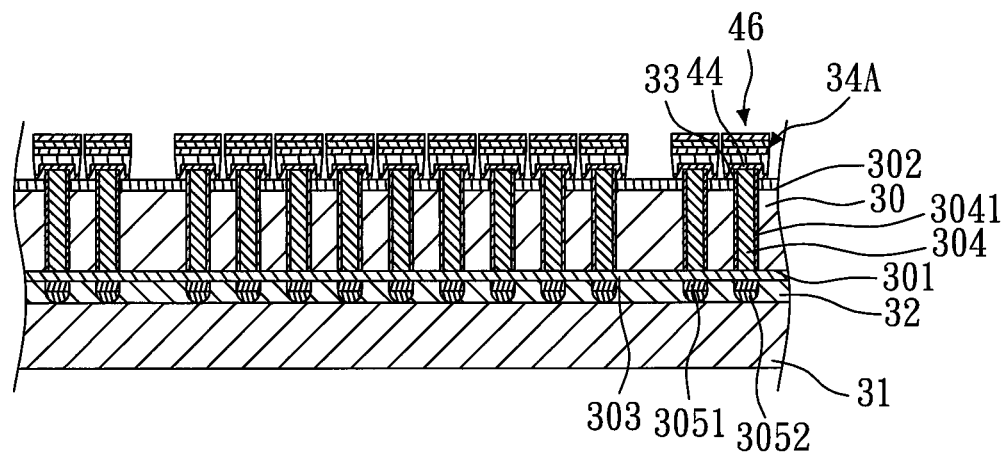

Referring to FIG. 19, a plurality of conductive elements are formed on the top surface of the conductive via 304 and the protruding portion of the liner 3041. In this embodiment, the conductive element is a protection cap 34A, and the first method for forming the protection cap 34A is described as follows.

Figure 20:
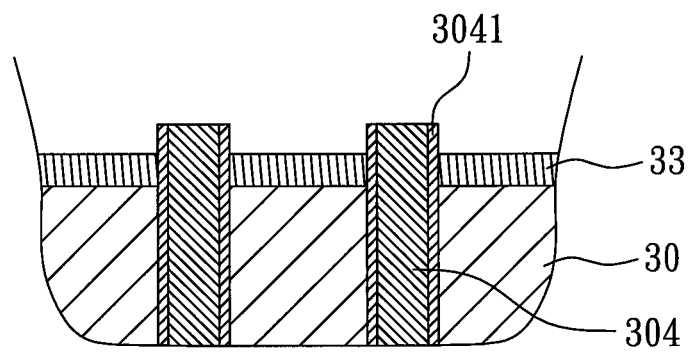
Figure 21:
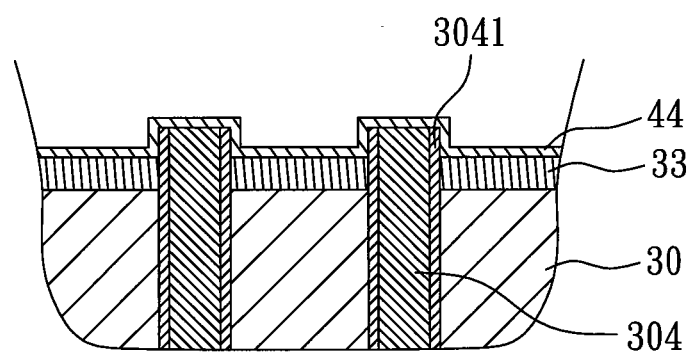
Figure 22:
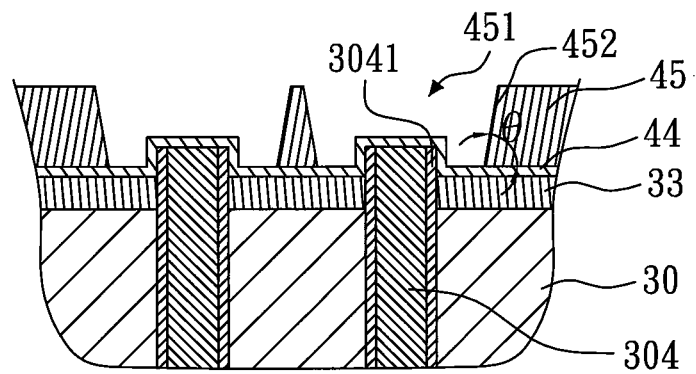
Figure 23:
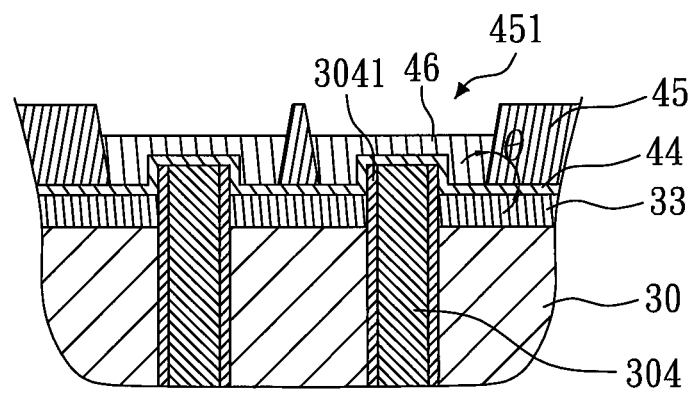

Referring to FIG. 20, a partially enlarged view of FIG. 18 is shown. Referring to FIG. 21, a seed layer 44 is sputtered on the backside passivation 33, the conductive vias 304 and the liners 3041. Referring to FIG. 22, a photo-resist layer 45 is formed on the seed layer 44, and a plurality of openings 451 are formed in the photo-resist layer 45. The positions of the openings 451 correspond to the conductive vias 304, and the top portion of each of the openings 451 is wider than the bottom portion of each of the openings 451. An inclined angle θ is formed between the sidewall 452 of the opening 451 and the seed layer 44. In the embodiment, the inclined angle θ is 70 degrees to 85 degrees. Referring to FIG. 23, a plurality of under ball metals (UBMs) 46 are formed in the openings 451. In the embodiment, the under ball metals (UBMs) 46 comprise a first layer 461, a second layer 462, a third layer 463 and a fourth layer 464. The first layer 461 is Cu, the second layer 462 is Ni, the third layer 463 is Pd, and the fourth layer 464 is Au. However, in other embodiment, the under ball metals (UBMs) 46 comprise a first layer, a second layer and a third layer. The first layer is Cu, the second layer is Ni, and the third layer is Sn/Ag alloy.

Figure 24:
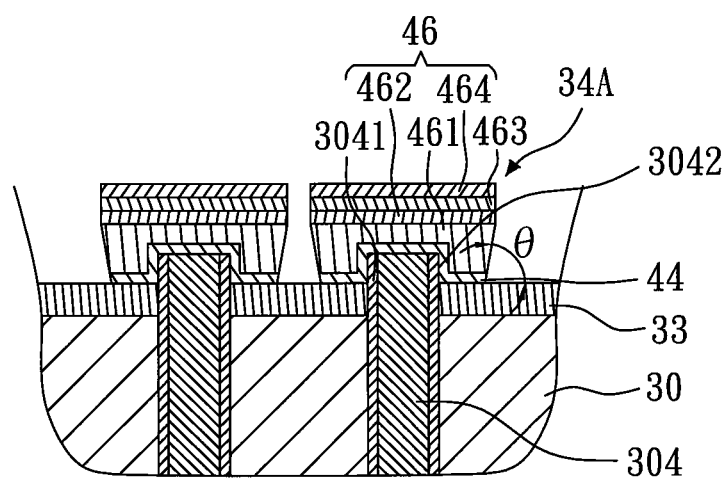

Referring to FIG. 24, the photo-resist layer 45 is removed, and part of the seed layer 44 that is disposed outside the UBMs 46 is removed, so as to form the protection caps 34A.

Figure 25:
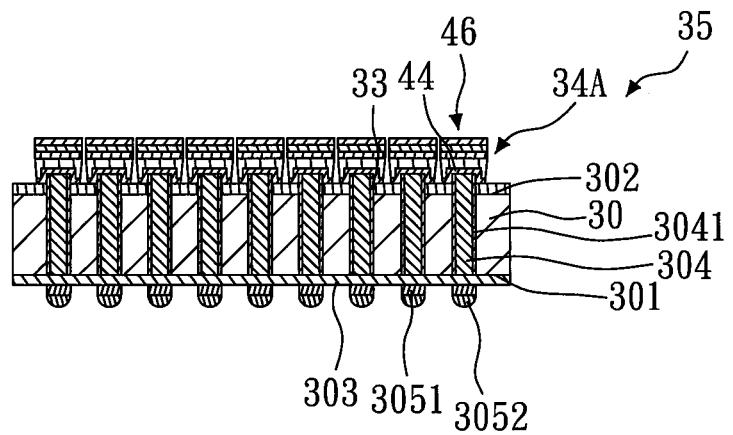
Figure 26:
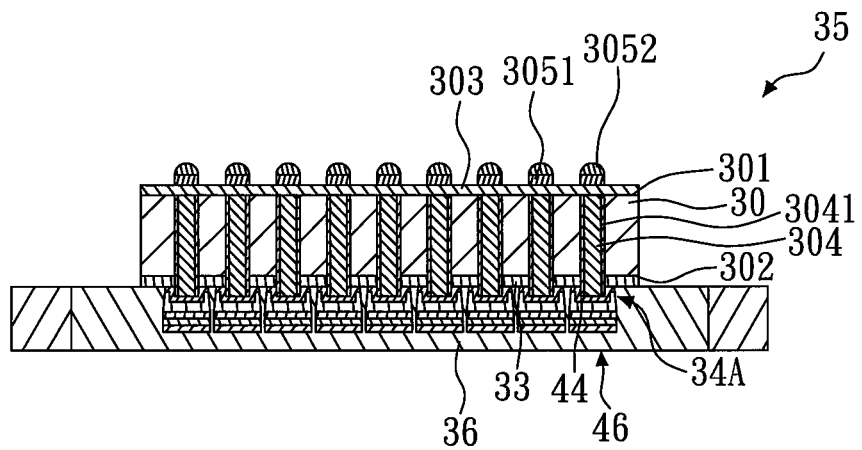

Referring to FIG. 25, the semiconductor wafer 30 is sawed and the first carrier 31 is removed, so as to form a plurality of semiconductor devices 35. Referring to FIG. 26, the semiconductor device 35 is mounted to a tape 36.

Figure 27:
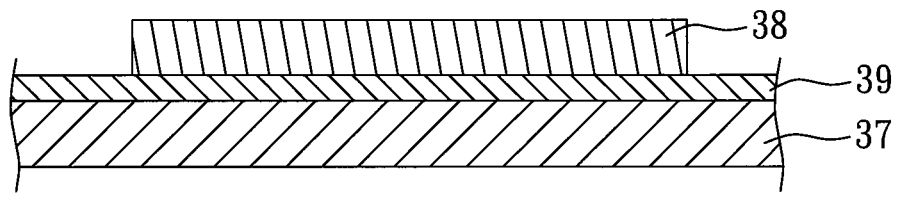
Figure 28:
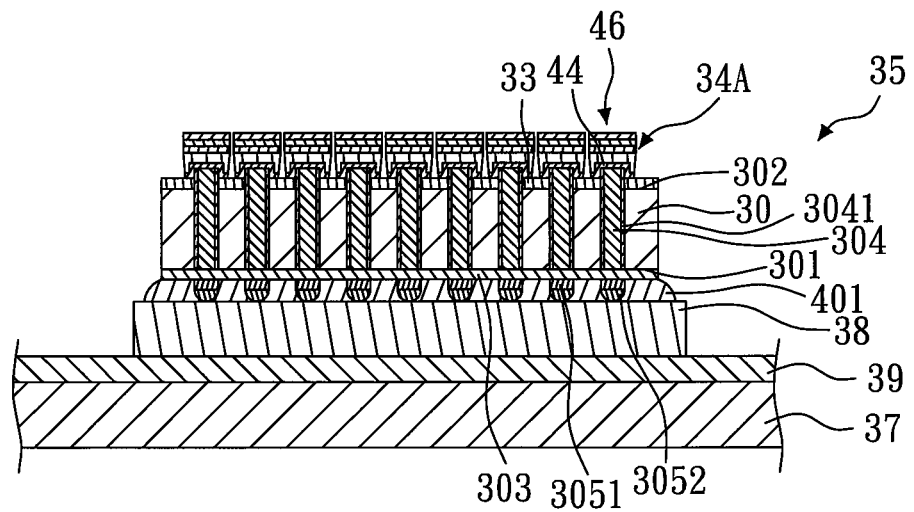

Referring to FIG. 27, a second carrier 37 and a bottom substrate 38 are provided. The bottom substrate 38 is attached to the second carrier 37 by a second adhesive layer 39. Referring to FIG. 28, the semiconductor device 35 is bonded to the bottom substrate 38. An underfill 401 is formed between the semiconductor device 35 and the bottom substrate 38 so as to protect the external connection elements 3052.

Figure 29:
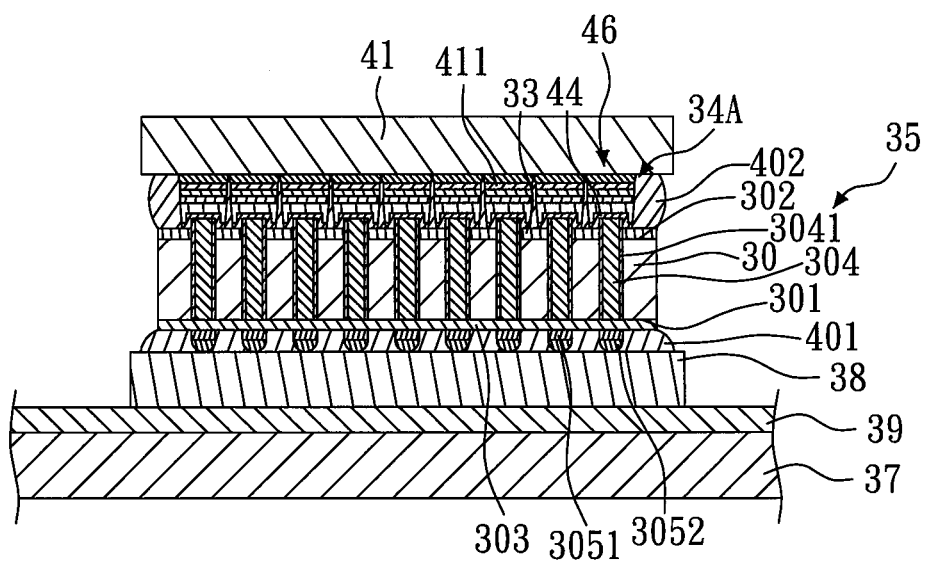

Referring to FIG. 29, a non-conductive polymer 402 is formed over the backside passivation 33, and a top semiconductor device 41 is stacked on the semiconductor device 35. Meanwhile, the protection cap 34A contacts a top external connection element 411 (for example, solder ball) of the top semiconductor device 41.

Figure 30:
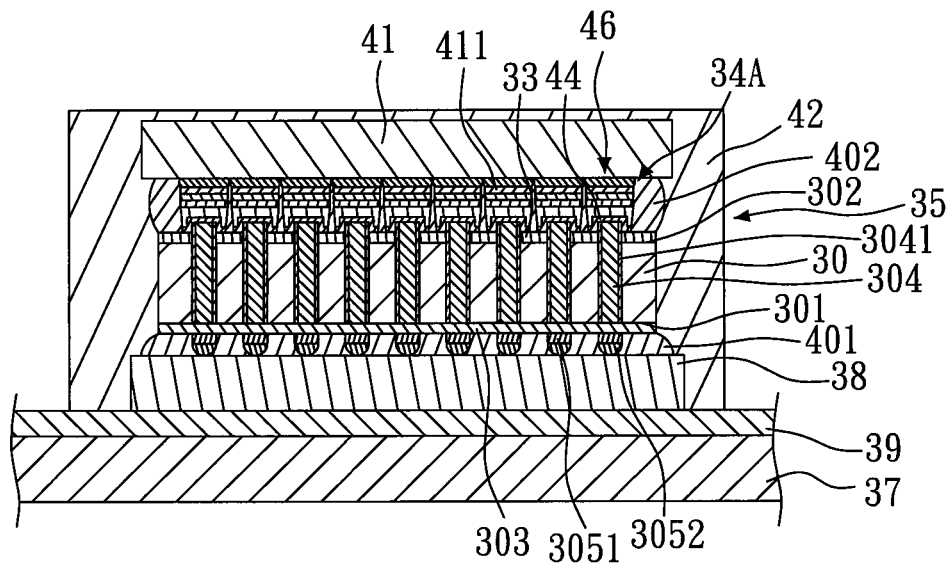
Figure 31:
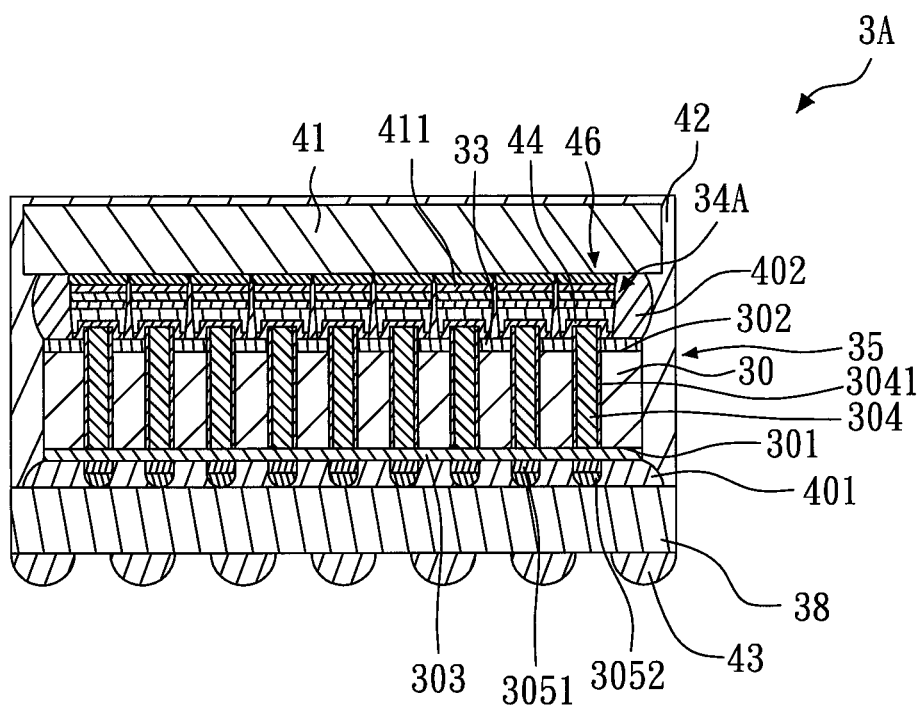

Referring to FIG. 30, a molding compound 42 is formed to encapsulate the bottom substrate 38, the semiconductor device 35 and the top semiconductor device 41. Referring to FIG. 31, the second carrier 37 and the second adhesive layer 39 are removed, and a plurality of solder balls 43 are formed on the bottom surface of the bottom substrate 38.

FIG. 31 shows the schematic view of a semiconductor package according to a first embodiment of the present invention. The semiconductor package 3A comprises a bottom substrate 38, a semiconductor device 35, a top semiconductor device 41 and a molding compound 42. The bottom substrate 38 is, for example, an organic substrate. The semiconductor device 35 is disposed on the bottom substrate 38 and comprises a semiconductor substrate 30, a backside passivation 33, at least one conductive via 304, at leas one conductive element (for example, a protection cap 34A) and at least one external connection element 3052. The semiconductor substrate 30 has a front surface 301 and a backside surface 302. In this embodiment, the semiconductor device 35 further comprises one or more wiring layers 303 disposed on the front surface 301 of the semiconductor substrate 30. The external connection elements 3052 are respectively disposed on the bonding pads 3051

The backside passivation 33 is disposed on the backside surface 302 of the semiconductor substrate 30. The conductive via 304 penetrates the semiconductor substrate 30 and the backside passivation 33, and a back end of the conductive via 304 and the liner 3041 protrude from the backside passivation 33. The top surface of the conductive via 304 is coplanar with the top surface of the liner 3041.

Referring to FIG. 24, the protection cap 34A is disposed on the protruded conductive via 304 and liner 3041. In this embodiment, the protection cap 34A has a seed layer 44 and a UBM 46. The seed layer 44 covers the protruded conductive via 304 and liner 3041 and part of the backside passivation 33. The UBM 46 is disposed over the seed layer 44.

The top portion of each of UBMs 46 is wider than the bottom portion of each of the UBMs 46. An inclined angle θ is formed between the sidewall of the UBM 46 and the backside passivation 33. In the embodiment, the inclined angle θ is 70 degrees to 85 degrees. In the embodiment, the under ball metals (UBMs) 46 comprise a first layer 461, a second layer 462, a third layer 463 and a fourth layer 464. The first layer 461 is Cu, the second layer 462 is Ni, the third layer 463 is Pd, and the fourth layer 464 is Au. However, in other embodiment, the under ball metals (UBMs) 46 comprise a first layer, a second layer and a third layer. The first layer is Cu, the second layer is Ni, and the third layer is Sn/Ag alloy.

The top semiconductor device 41 is disposed on the semiconductor device 35 and has at least one top external connection element 411 on a surface thereof. The protection cap 34A contacts the top external connection element 411, and the position of the top external connection element 411 is aligned with the conductive via 304. In this embodiment, the top external connection element 411 is disposed on the central axis of the conductive via 304.

The molding compound 42 encapsulates the bottom substrate 38, the semiconductor device 35 and the top semiconductor device 41.

Preferably, the package 3A further comprises an underfill 401, a non-conductive polymer 402 and a plurality of solder balls 43. The underfill 401 is disposed between the semiconductor device 35 and the bottom substrate 38 so as to protect the external connection elements 3052. The non-conductive polymer 402 is disposed between the top semiconductor device 41 and the semiconductor device 35. The solder balls 43 are disposed on the bottom surface of the bottom substrate 38.

The advantages of the semiconductor package 3A are described as follows. The back end 3041 of the conductive via 304 is covered by the protection cap 34A. Therefore, the protection cap 34A can protect the back end 3041 from being damaged. Further, the size of the protection cap 34A is large, thus it is easy to perform a probe test process.

Figure 32:
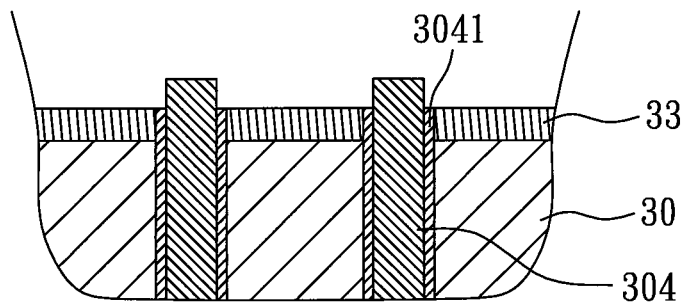
FIGS. 32 to 34 show the schematic views of the semiconductor process for making a semiconductor package according to a second embodiment of the present invention.
Figure 33:
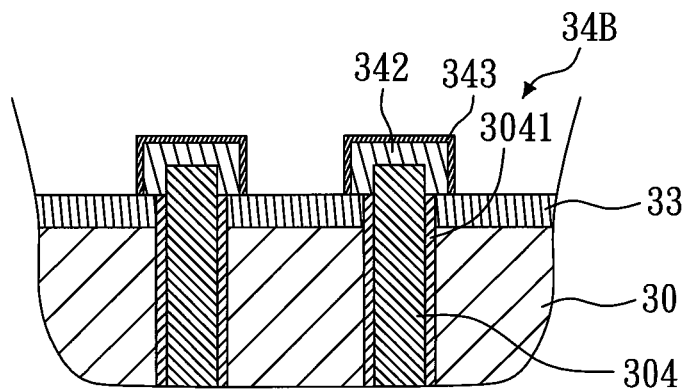
Figure 34:
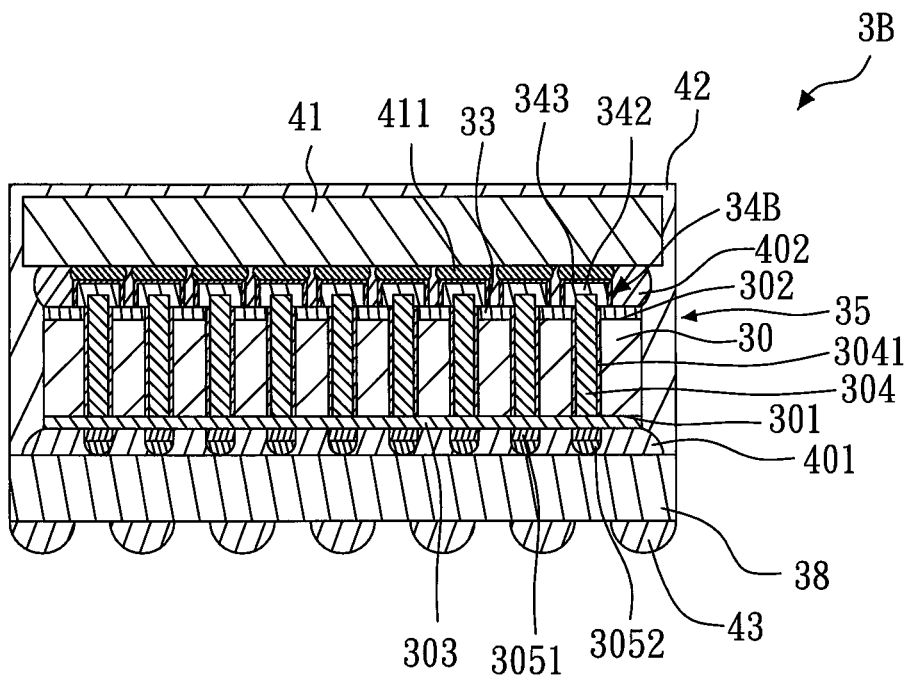

FIGS. 32 to 34 show the schematic views of the semiconductor process for making a semiconductor package according to a second embodiment of the present invention. The semiconductor process according to the second embodiment is substantially the same as the semiconductor process (FIGS. 14 to 31) according to the first embodiment except that the protection cap 34B (FIG. 33) is formed in a different way as described below. Referring to FIG. 32, part of the liners 3041 that protrudes from the backside passivation 33 is removed, so as to expose a portion of each of the conductive via 304. Thus, the top surface of the liner 3041 is coplanar with the top surface of the backside passivation 33. That is, the conductive via 304 has a protruding portion which protrudes from the backside passivation 33. The protruding portion has a top surface and a side surface, wherein the conductive via 304 is surrounded by the liner 3041 except the top surface and the side surface of the protruding portion. Referring to FIG. 33, the top surface and the side surface of the protruding portion of each conductive via 304 is electroless plated with a first metal 342 directly. The first metal 342 has a substantially uniform thickness of at least about 2 μm (preferably between about 3-4 μm) and contacts the backside passivation 33, so as to form a protection cap 34B. Preferably, the first metal 342 is further electroless plated with a second metal 343, and the second metal 343 has a substantially uniform thickness. In this embodiment, the first metal 342 is nickel and the second metal 343 is Au, Pd/Au alloy or Sn/Ag alloy.

FIG. 34 shows the schematic view of a semiconductor package according to a second embodiment of the present invention. The semiconductor package 3B according to the second embodiment is substantially the same as the semiconductor package 3A (FIG. 31) according to the first embodiment, and the same elements are designated by the same reference numbers. The difference between the semiconductor package 3B and the semiconductor package 3A (FIG. 31) is the structure of the protection cap 34B. In this embodiment, only the conductive via 304 protrudes from the backside passivation 33. The protection cap 34B comprises a first metal 342 disposed on the protruded conductive via 304, and the first metal 342 has a substantially uniform thickness and contacts the backside passivation 33. Preferably, the protection cap 34B further comprises a second metal 343 over the first metal 342. The first metal 342 is nickel and the second metal 343 is gold.

Figure 35:
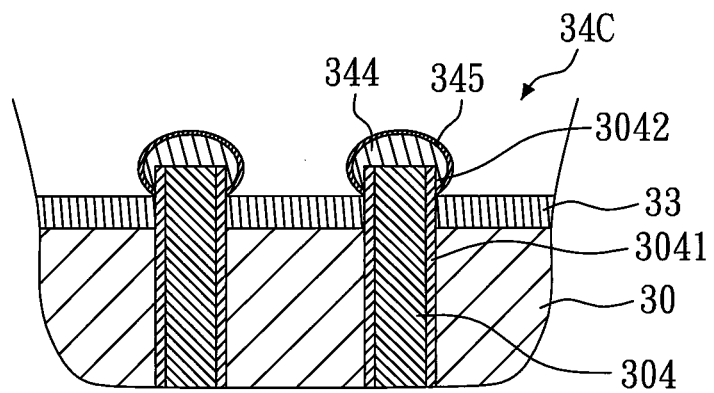
FIGS. 35 to 36 show the schematic views of the semiconductor process for making a semiconductor package according to a third embodiment of the present invention.
Figure 36:
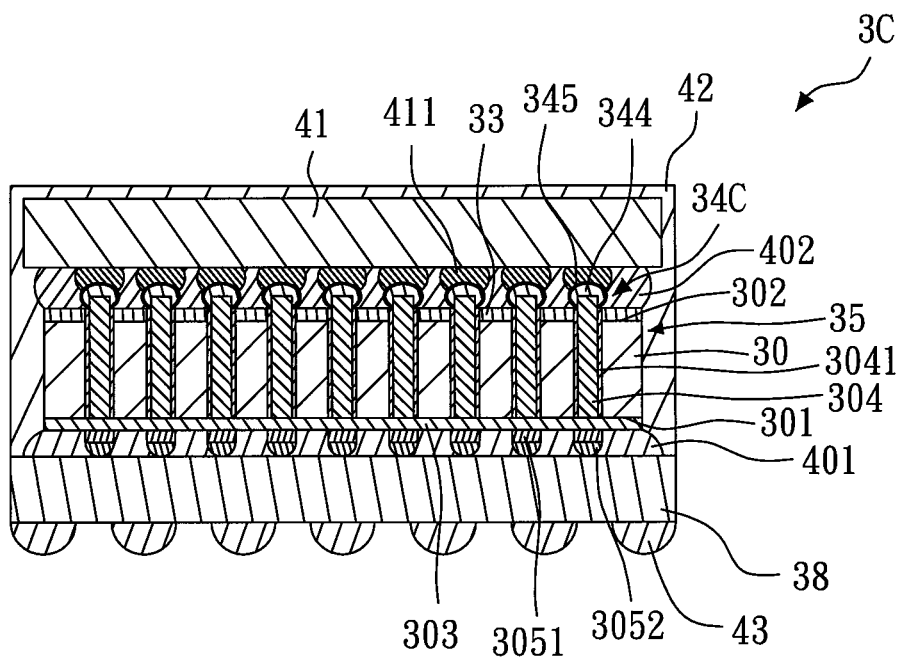
Figure 37:
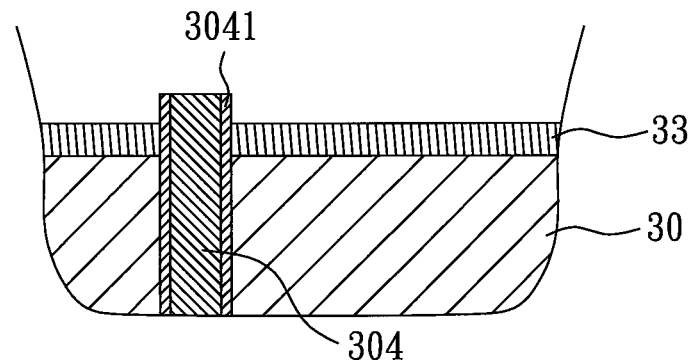
FIGS. 37 to 43 show the schematic views of the semiconductor process for making a semiconductor package according to a fourth embodiment of the present invention.

FIGS. 35 to 36 show the schematic views of the semiconductor process for making a semiconductor package according to a third embodiment of the present invention. The semiconductor process according to the third embodiment is substantially the same as the semiconductor process (FIGS. 14 to 31) according to the first embodiment. The difference between the semiconductor process according to the third embodiment and the semiconductor process (FIGS. 14 to 31) according to the first embodiment is the method for forming the protection cap. The protection cap 34C (FIG. 35) is formed by a third method described as follows. In this embodiment, referring to FIG. 35, the tops of the conductive vias 304 and the liners 3041 are plated with a third metal 344 for an overtime, so that an excess of the third metal 344 flows off along the sidewall 3042 of the liner 3041. Thus, the third metal 344 is in a ball shape and may contact the backside passivation 33 or not. Preferably, the third metal 344 is further plated with a fourth metal 345. The third metal 344 is nickel and the fourth metal 345 is gold.

FIG. 36 shows the schematic view of a semiconductor package according to a third embodiment of the present invention. The semiconductor package 3C according to the third embodiment is substantially the same as the semiconductor package 3A (FIG. 31) according to the first embodiment, and the same elements are designated by the same reference numbers. The difference between the semiconductor package 3C and the semiconductor package 3A (FIG. 31) is the structure of the protection cap 34C. In this embodiment, the protection cap 34C comprises a third metal 344 covering the protruded conductive via 304 and the liner 3041, and the protection cap 34C is in a ball shape. Preferably, the protection cap 34C further comprises a fourth metal 345 over the third metal 344. The third metal 344 is nickel and the fourth metal 345 is gold.

Figure 38:
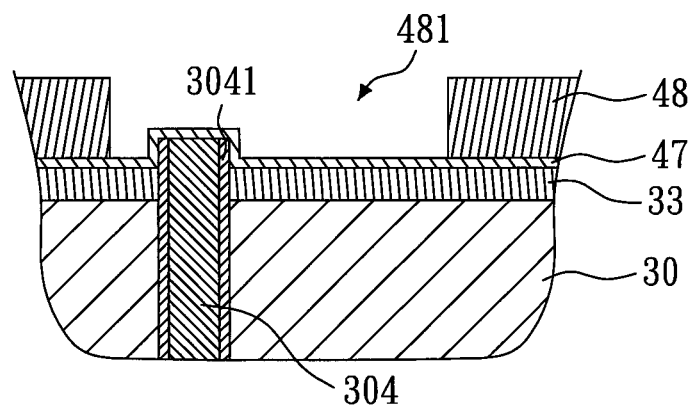
Figure 39:
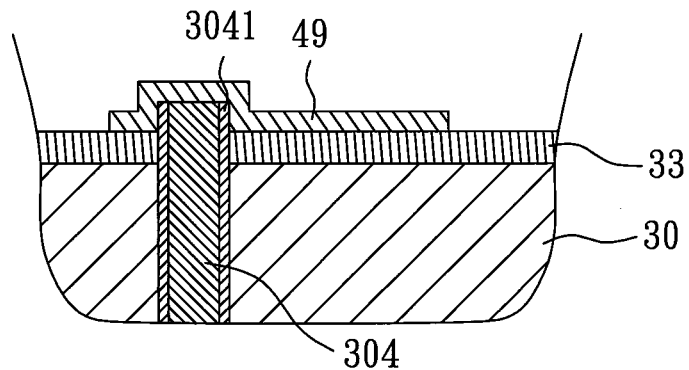
Figure 40:
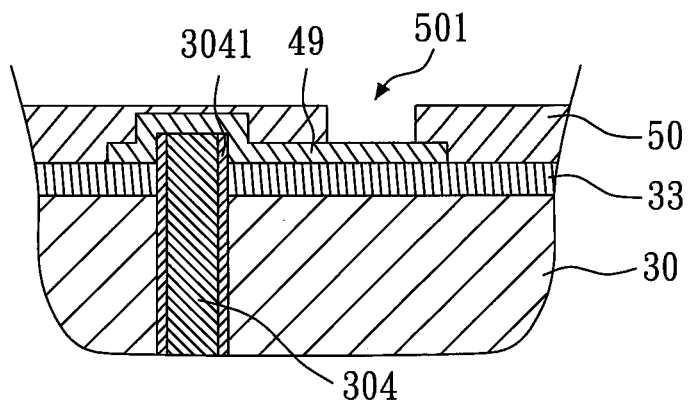
Figure 41:
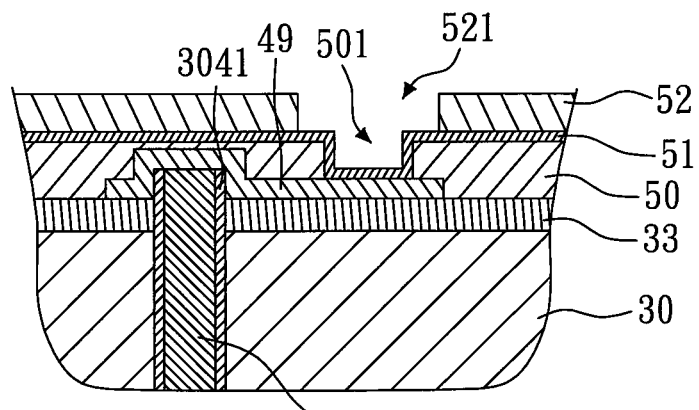
Figure 42:
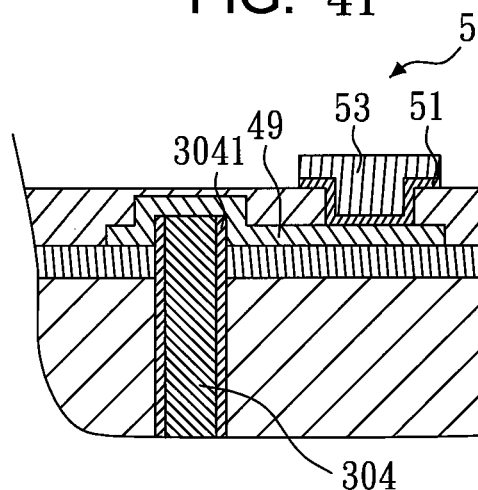

FIGS. 37 to 43 show the schematic views of the semiconductor process for making a semiconductor package according to a fourth embodiment of the present invention. The semiconductor process according to the fourth embodiment is substantially the same as the semiconductor process (FIGS. 14 to 31) according to the first embodiment. The difference between the semiconductor process according to the fourth embodiment and the semiconductor process (FIGS. 14 to 31) according to the first embodiment is that the fourth embodiment does not form the protection caps 34A, 34B, 34C, and the conductive element is a RDL 49 (FIG. 39). The method for protecting protruded conductive via 304 and liner 3041 is described as follows. In this embodiment, referring to FIG. 37, a partially enlarged view of FIG. 18 is shown. Referring to FIG. 38, a first seed layer 47 (such as a Ti/Cu layer) is sputtered on the entire surface of the backside passivation 33, the conductive vias 304 and the liners 3041. A first photo-resist layer 48 is formed on the first seed layer 47, and a plurality of first openings 481 are formed in the first photo-resist layer 48. The positions of the first openings 481 correspond to the conductive vias 304, and the area of a cross section of each first opening 481 is larger than that of each conductive via 304. Referring to FIG. 39, a redistribution layer (RDL) 49 (such as a Cu layer) is plated on the first seed layer 47 only in the first openings 481. Then, the first photo-resist layer 48 is removed, and part of the first seed layer 47 that is disposed outside the RDL 49 is removed. Referring to FIG. 40, a dielectric layer 50 is formed on the RDL 49 and the backside passivation 33. Then, a plurality of second openings 501 are formed in the dielectric layer 50 to expose part of the RDL 49. The positions of the second openings 501 do not correspond to that of the conductive vias 304. Referring to FIG. 41, a second seed layer 51 is sputtered on the dielectric layer 50 and in the second openings 501. A second photo-resist layer 52 is formed on the second seed layer 51. Then, a plurality of third openings 521 are formed in the second photo-resist layer 52 to expose the second openings 501. Referring to FIG. 42, a plurality of UBMs 53 are formed in the third openings 521. Then, the second photo-resist layer 52 is removed, and part of the second seed layer 51 that is disposed outside the UBMs 53 is removed, so as to form a protection structure 54.

Figure 43:
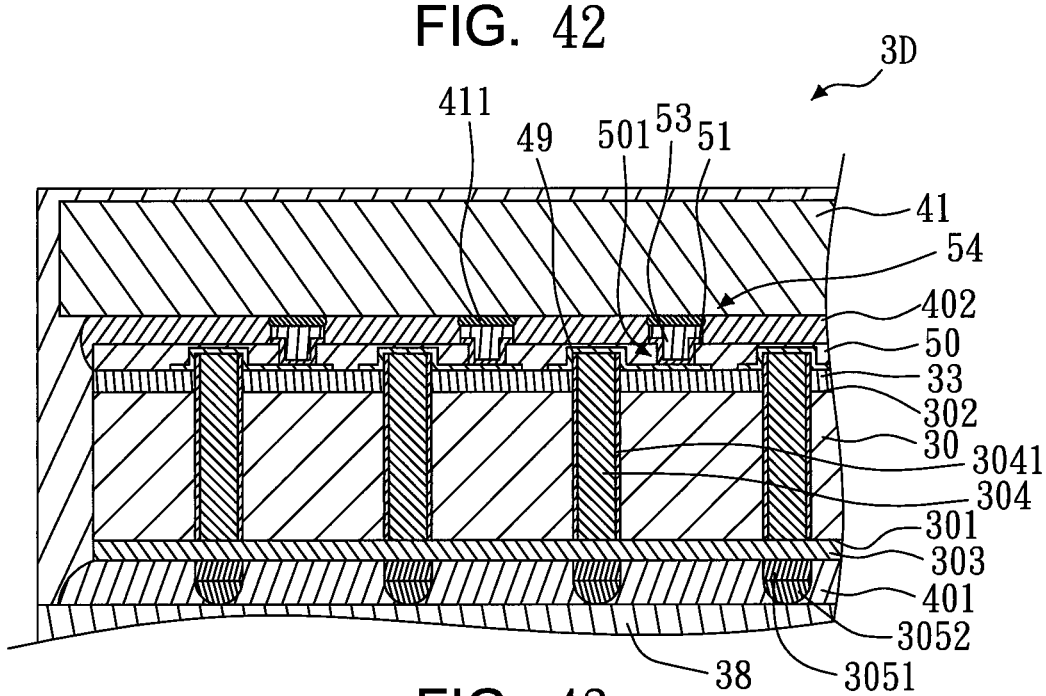

FIG. 43 shows the schematic view of a semiconductor package according to a fourth embodiment of the present invention. The semiconductor package 3D according to the fourth embodiment is substantially the same as the semiconductor package 3A (FIG. 31) according to the first embodiment, and the same elements are designated by the same reference numbers. The difference between the semiconductor package 3D and the semiconductor package 3A (FIG. 31) is that the protection structure 54 is not the protection caps 34A, 34B, 34C, and the conductive element is a RDL 49. In this embodiment, the protection structure 54 comprises a RDL 49, a dielectric layer 50, a second seed layer 51 and a UBM 53. The RDL 49 covers the conductive via 304, the liner 3041 and part of the backside passivation 33. The dielectric layer 50 is disposed over the RDL 49 and the backside passivation 33, and has a second opening 501 to expose part of the RDL 49. The second seed layer 51 is disposed in the second opening 501 and on part of the dielectric layer 50. The UBM 53 is disposed over the seed layer 51. The UBM 53 contacts the top external connection element 411, and the position of the top external connection element 411 is aligned with the UBM 53.

Figure 44:
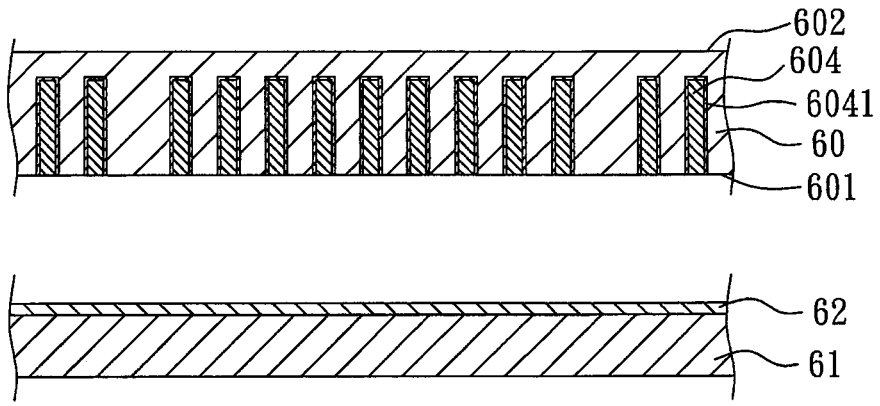
FIGS. 44 to 58 show the schematic views of the semiconductor process for making a semiconductor package according to a fifth embodiment of the present invention.

FIGS. 44 to 58 show the schematic views of the semiconductor process for making a semiconductor package according to a fifth embodiment of the present invention. Referring to FIG. 44, a semiconductor wafer 60 and a first carrier 61 are provided. The semiconductor wafer 60 has a front surface 601, a backside surface 602 and a plurality of conductive vias 604. The conductive vias 604 are disposed in the semiconductor wafer 60, and each of the conductive vias 604 is surrounded by a liner 6041.

Figure 45:
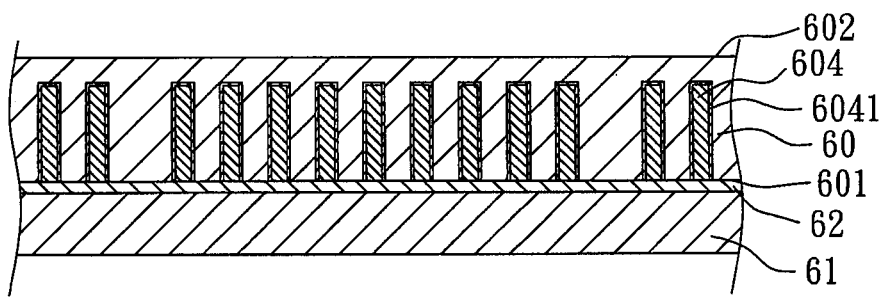
Figure 46:
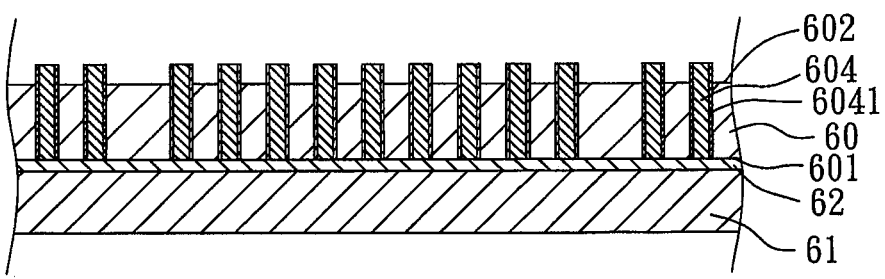
Figure 47:
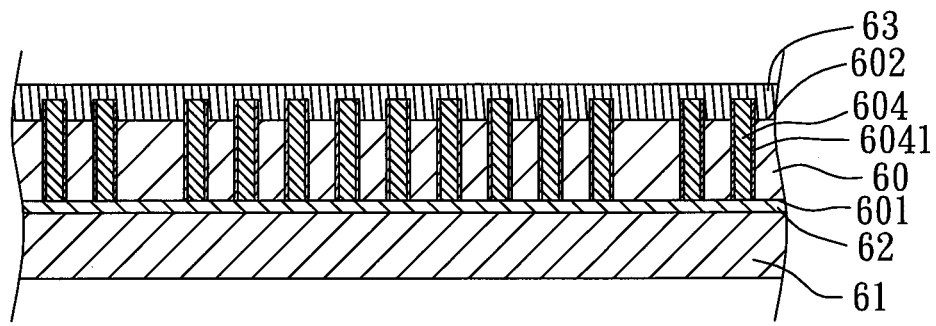
Figure 48:
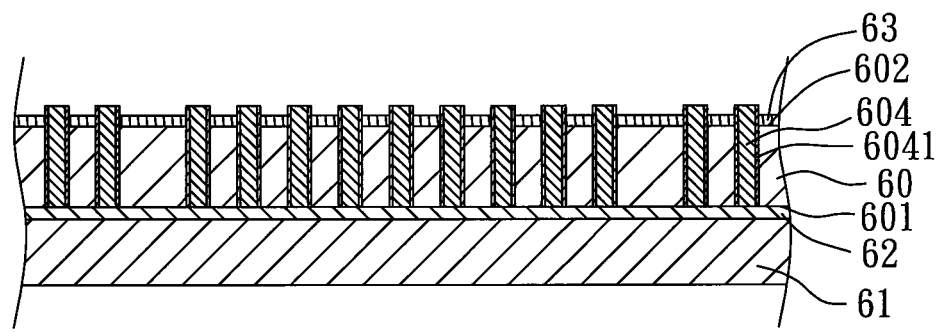

Referring to FIG. 45, the front surface 601 of the semiconductor wafer 60 is mounted to the first carrier 61 by a first adhesive layer 62. Referring to FIG. 46, the backside surface 602 of the semiconductor wafer 60 is ground and then etched, so as to expose the back ends of the conductive vias 604 and the liners 6041. Referring to FIG. 47, a backside passivation 63 is formed over the backside surface 602 and covers the back ends of the conductive vias 604 and the liners 6041. Referring to FIG. 48, part of the backside passivation 63 is removed (for example, by developing or etching) so that the back ends of the conductive vias 604 and the liners 6041 protrude from the backside passivation 63.

Figure 49:
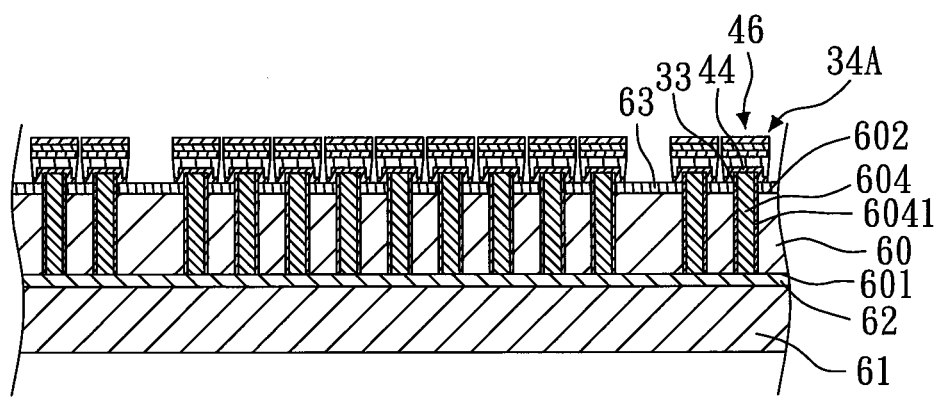

Referring to FIG. 49, a plurality of protection caps 34A are formed on the protruded back ends of the conductive vias 604 and the liners 6041. The method for forming the protection cap 34A is described as above. It is to be noted that the protection cap 34A may be replaced by the protection caps 34B, 34C, or the protection structure 54.

Figure 50:
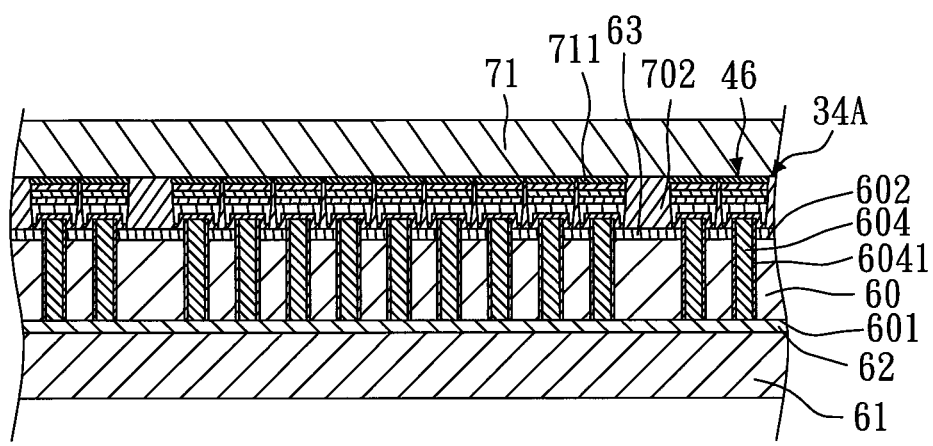

Referring to FIG. 50, a non-conductive polymer 702 is formed over the backside passivation 63, and a top semiconductor wafer 71 is bonded to the semiconductor wafer 60. Meanwhile, the protection caps 34A contact the top external connection elements 711 of the top semiconductor wafer 71, and the positions of the top external connection elements 711 of the top semiconductor wafer 71 are aligned with the conductive vias 604. Then, the first carrier 61 and the first adhesive layer 62 are removed.

Figure 51:
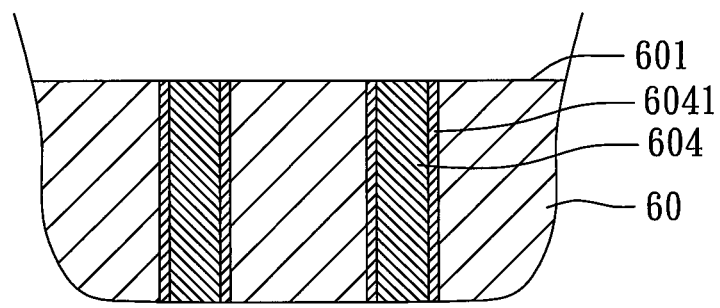
Figure 52:
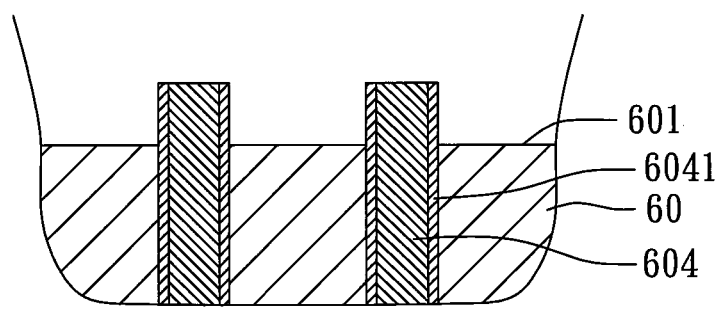
Figure 53:
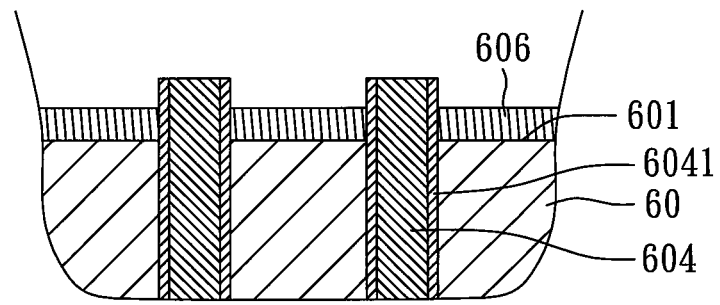

Referring to FIG. 51, a partially enlarged view of the front surface 601 is shown. Referring to FIG. 52, part of the front surface 601 of the semiconductor wafer 60 is ground then etched, so that the front ends of the conductive vias 604 and the liners 6041 protrude from the front surface 601. Referring to FIG. 53, a front passivation 606 is formed over the front surface 601 and then removed (for example, by developing or etching). Thus, the front passivation 606 does not cover the front ends of the conductive vias 604 and the liners 6041, and the front ends of the conductive vias 604 and the liners 6041 protrude from the front passivation 606.

Figure 54:
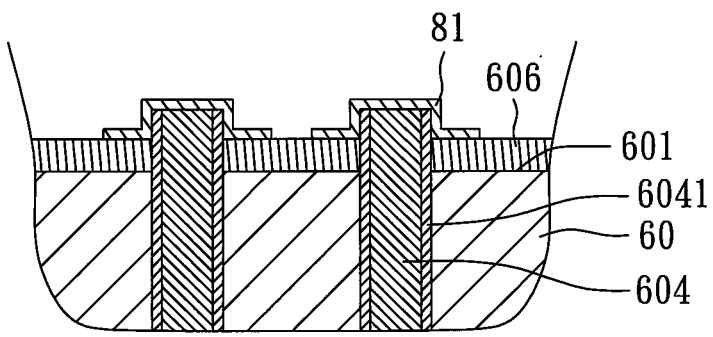
Figure 55:
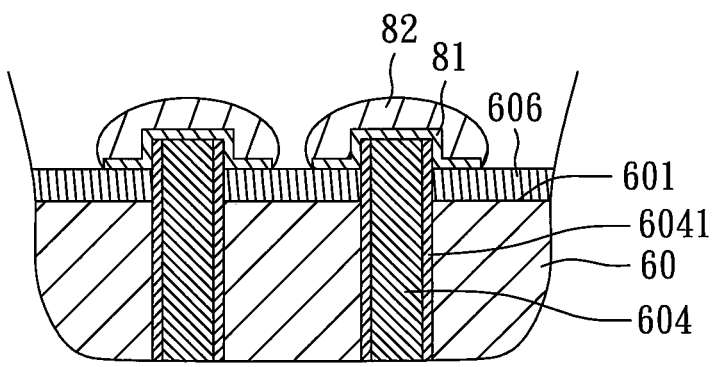

Referring to FIG. 54, a plurality of UBMs 81 are formed to cover the front ends of the conductive vias 604, the liners 6041 and part of the front passivation 606. Referring to FIG. 55, a plurality of solder balls 82 are formed on the UBMs 81.

Figure 56:
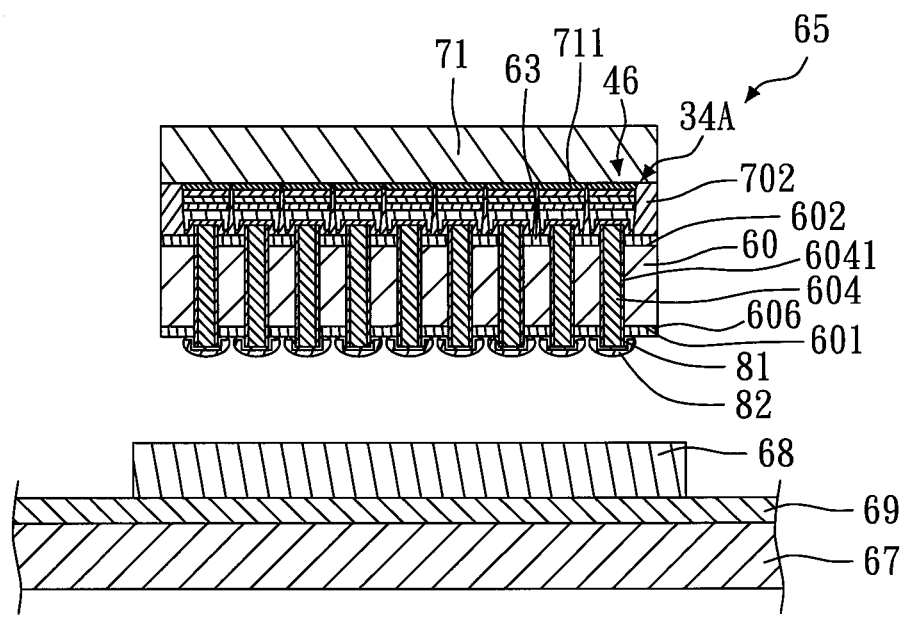

Referring to FIG. 56, the semiconductor wafer 60 and the top semiconductor wafer 71 are sawed to form a plurality of stacked semiconductor devices 65. A second carrier 67 and a bottom substrate 68 are provided, wherein the bottom substrate 68 is attached to the second carrier 67 by a second adhesive layer 69.

Figure 57:
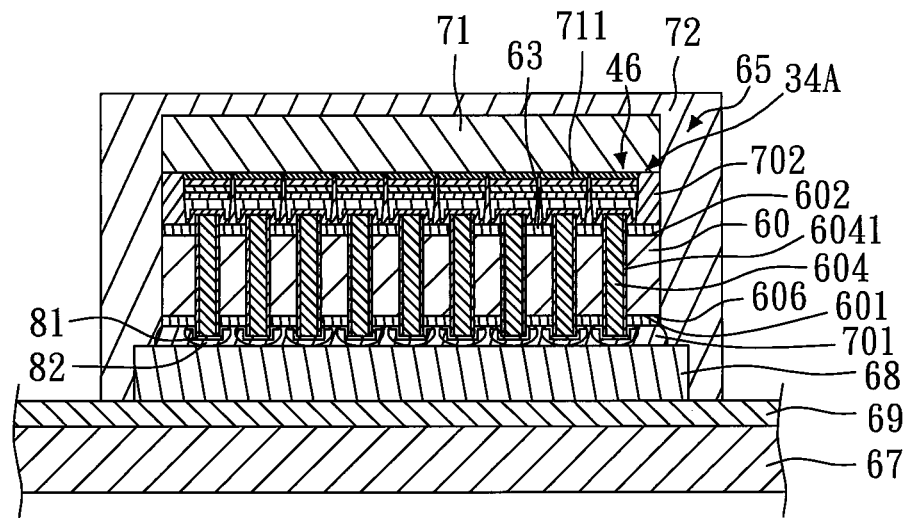

Referring to FIG. 57, the stacked semiconductor device 65 is bonded to the bottom substrate 68. An underfill 701 is formed between the stacked semiconductor devices 65 and the bottom substrate 68 so as to protect the solder balls 82. A molding compound 72 is formed to encapsulate the bottom substrate 68 and the stacked semiconductor device 65.

Figure 58:
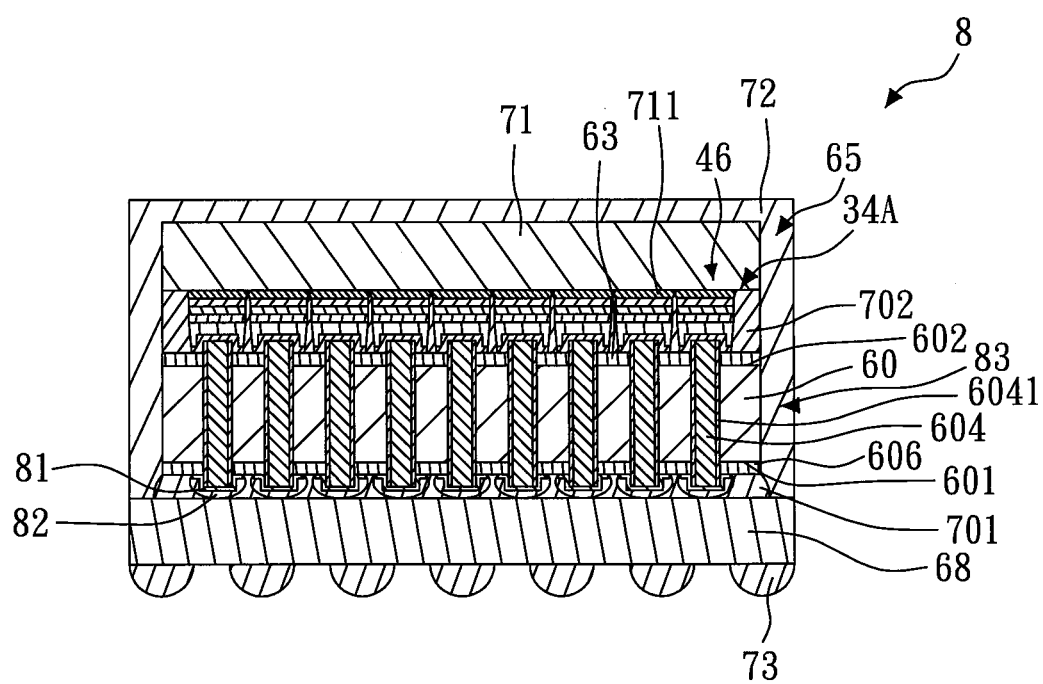

Referring to FIG. 58, the second carrier 67 and the second adhesive layer 69 are removed. Then, a plurality of solder balls 73 are formed on the bottom surface of the bottom substrate 68.

FIG. 58 shows the schematic view of a semiconductor package according to a fifth embodiment of the present invention. The semiconductor package 8 comprises a bottom substrate 68, a semiconductor device 83, a top semiconductor device 71 and a molding compound 72. The bottom substrate 68 is, for example, an organic substrate. The semiconductor device 83 is disposed on the bottom substrate 68 and comprises a semiconductor substrate 60, a backside passivation 63, at least one conductive via 604, at leas one protection cap 34A, a front passivation 606, at least one solder ball 82 and at least one UBM 81. The semiconductor substrate 60 has a front surface 601 and a backside surface 602.

The backside passivation 63 is disposed on the backside surface 602 of the semiconductor substrate 60. The front passivation 606 is disposed on the front surface 601 of the semiconductor substrate 60. The conductive via 604 penetrates the semiconductor substrate 60, the backside passivation 63 and the front passivation 606. The conductive via 604 is surrounded by a liner 6041. A back end of the conductive via 604 and the liner 6041 protrude from the backside passivation 63, and a front end of the conductive via 604 and the liner 6041 protrude from the front passivation 606.

The protection cap 34A is disposed on the back end of the conductive via 604 and the liner 6041. In this embodiment, the protection cap 34A has a seed layer 44 and a UBM 46. The seed layer 44 covers the protruded back end of the conductive via 604, the liner 6041 and part of the backside passivation 63. The UBM 46 is disposed over the seed layer 44. It is to be noted that the protection cap 34A may be replaced by the protection caps 34B, 34C, the protection structure 54, or the surface finish layer 14.

The UBM 81 covers the front end of the conductive via 604, the liner 6041 and part of the front passivation 606, and the solder ball 82 is disposed on the UBM 81. The solder ball 82 is electrically connected to the bottom substrate 68.

The top semiconductor device 71 is disposed on the semiconductor device 83 and has at least one top external connection element 711 on a surface thereof. The protection cap 34A contacts the top external connection element 711, and the position of the top external connection element 711 is aligned with the conductive via 704. In this embodiment, the top external connection element 711 is disposed on the central axis of the conductive via 604.

The molding compound 72 encapsulates the bottom substrate 68, the semiconductor device 83 and the top semiconductor device 71.

Preferably, the semiconductor package 8 further comprises an underfill 701, a non-conductive polymer 702 and a plurality of solder balls 73. The underfill 701 is disposed between the semiconductor device 83 and the bottom substrate 68 so as to protect the solder ball 82. The non-conductive polymer 702 is disposed between the top semiconductor device 71 and the semiconductor device 83. The solder balls 73 are disposed on the bottom surface of the bottom substrate 68.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor package, comprising:
  a package substrate;
  a semiconductor device disposed on the package substrate, and comprising:
    a semiconductor substrate having a front surface and a backside surface;
    a backside passivation disposed on the backside surface of the semiconductor substrate;
    a conductive via disposed in the semiconductor substrate and surrounded by a liner, the conductive via and the liner protruding from the backside passivation, and a top surface of the conductive via is substantially coplanar with a top surface of the liner; and
    a conductive element covering the top surface of the conductive via and the protruding portion of the liner, wherein the conductive element is a RDL;
    a dielectric layer disposed over the RDL and the backside passivation, and having an opening to expose part of the RDL;
    a seed layer disposed in the opening and on part of the dielectric layer; and
    a UBM disposed over the seed layer;
  a top semiconductor device disposed on the semiconductor device and having at least one top external connection element on a surface thereof, wherein the conductive element contacts the top external connection element, and the position of the top external connection element is aligned with the conductive via; and
  a molding compound encapsulating the package substrate, the semiconductor device and the top semiconductor device.

2. The semiconductor package as claimed in claim 1, wherein the semiconductor device further comprises one or more wiring layers disposed on the front surface of the semiconductor substrate.

3. The semiconductor package as claimed in claim 1, wherein the semiconductor device further comprises a front passivation, a UBM and a solder ball, wherein the front passivation is disposed on the front surface of the semiconductor substrate, the conductive via and the liner protruding from the front passivation.

4. The semiconductor package as claimed in claim 3, wherein the UBM covers the protruded conductive via and liner and part of the front passivation, and the solder ball is disposed on the UBM.

5. The semiconductor package as claimed in claim 1, further comprising a non-conductive polymer, wherein the non-conductive polymer is disposed between the top semiconductor device and the semiconductor device.

6. The semiconductor package as claimed in claim 1, further comprising an underfill wherein the underfill is disposed between the semiconductor device and the package substrate.

7. The semiconductor package as claimed in claim 1, further comprising a plurality of solder balls, wherein the solder balls are disposed on the package substrate.

8. A semiconductor device, comprising:
- a semiconductor substrate having a front surface and a backside surface;
- a backside passivation disposed on the backside surface of the semiconductor substrate;
- a conductive via disposed in the semiconductor substrate and surrounded by a liner except a top surface thereof, wherein the conductive via and the liner protrude from the backside passivation, and the top surface of the conductive via is substantially coplanar with a top surface of the liner; and
- a conductive element covering the top surface of the conductive via and the protruding portion of the liner, wherein the conductive element is a RDL;
- a dielectric layer disposed over the RDL and the backside passivation, and having an opening to expose part of the RDL;
- a seed layer disposed in the opening and on part of the dielectric layer; and
- a UBM disposed over the seed layer.

9. The semiconductor device as claimed in claim 8, further comprising one or more wiring layers disposed on the front surface of the semiconductor substrate.

10. The semiconductor device as claimed in claim 8, further comprising a front passivation, a UBM and a solder ball, wherein the front passivation is disposed on the front surface of the semiconductor substrate, the conductive via and the liner protrude from the front passivation, the UBM covers the protruded conductive via and liner and part of the front passivation, and the solder bail is disposed on the UBM.

11. The semiconductor device as claimed in claim 10, wherein the UBM covers a bottom surface of the conductive via and liner and part of the front passivation and the solder ball is disposed on the UBM of the front surface.

12. The semiconductor device as claimed in claim 8, wherein the conductive via includes a bottom surface which is exposed at the front surface of the semiconductor substrate.

13. The semiconductor device as claimed in claim 12, wherein the bottom surface of the conductive via is substantially coplanar with the front surface of the semiconductor substrate.

14. The semiconductor device as claimed in claim 12, wherein the bottom surface protrudes from the front surface of the semiconductor substrate.

15. The semiconductor device of Claim 8, wherein the conductive via extends through the semiconductor substrate from the front surface to the backside surface.

16. The semiconductor device of claim 15, wherein the conductive via includes a bottom surface and the bottom surface and top surface are exposed from the semiconductor substrate.

* * * * *